United States Patent [19]

Yamazaki

[11] Patent Number: 5,044,406
[45] Date of Patent: Sep. 3, 1991

[54] PIPE MADE FROM A SUPERCONDUCTING CERAMIC MATERIAL

[75] Inventor: Shunpei Yamazaki, Tokyo, Japan

[73] Assignee: Semiconductor Energy Laboratory Co., Ltd., Atsugi, Japan

[21] Appl. No.: 167,912

[22] Filed: Mar. 14, 1988

[30] Foreign Application Priority Data

Mar. 18, 1987 [JP] Japan .................. 62-63391
Mar. 18, 1987 [JP] Japan .................. 62-63392

[51] Int. Cl.⁵ .................. F16L 11/12; H01B 12/00
[52] U.S. Cl. .................. 138/143; 138/140; 138/149; 138/177; 138/178; 505/1; 505/812; 505/809; 505/879; 505/885; 428/34.6; 428/930
[58] Field of Search ............. 138/140, 143, 141, 145, 138/149, 177, 178; 174/126.4, 15.3, 15.4, 15.5; 505/886, 919, 887, 812, 813, 814, 879, 885, 809, 924, 866, 1; 428/34.4, 34.6, 930

[56] References Cited

U.S. PATENT DOCUMENTS

| 2,139,431 | 12/1938 | Vatter | 174/126.4 |
| 2,332,891 | 10/1943 | Clark | 174/126.4 |
| 3,205,413 | 9/1965 | Anderson | 174/15.4 |
| 3,310,433 | 3/1967 | Tragert | 174/126.4 |
| 3,428,926 | 2/1969 | Bogner et al. | 174/15.4 |
| 3,444,495 | 5/1969 | Thomas | 505/880 |
| 3,472,944 | 10/1969 | Morton et al. | 174/15.5 |
| 3,713,211 | 1/1973 | Freeman | 174/15.4 |
| 3,728,463 | 4/1973 | Kullmann et al. | 174/15.5 |
| 4,329,539 | 5/1982 | Tanaka et al. | 174/15.5 |
| 4,421,946 | 12/1983 | Furuto et al. | 174/15.5 |
| 4,492,089 | 1/1985 | Rohner et al. | 138/149 X |
| 4,571,453 | 2/1986 | Takaoka et al. | 174/126.4 |
| 4,754,249 | 6/1988 | Yamamoto et al. | 174/15.4 |
| 4,785,142 | 11/1988 | Smith et al. | 174/15.5 |
| 4,804,649 | 2/1989 | Sherif | 505/1 |
| 4,813,332 | 3/1989 | Jasper | 505/885 |
| 4,843,059 | 6/1989 | Deslandes et al. | 505/1 |

FOREIGN PATENT DOCUMENTS 62-4305 1/1987 Japan .
88-08618 11/1988 World Int. Prop. O. .......... 505/885

Primary Examiner—James E. Bryant, III
Attorney, Agent, or Firm—Sixbey, Friedman, Leedom & Ferguson

[57] ABSTRACT

A pipe comprises a hollow support member made from a member selected from copper and copper compounds and a copper oxide superconducting ceramic material which covers the inner surface of the support member with a space kept in the pipe for use in a magnet or power accumulator device.

5 Claims, 2 Drawing Sheets

PIPE MADE FROM A SUPERCONDUCTING CERAMIC MATERIAL

FIELD OF THE INVENTION

The present invention relates to a pipe, that is a hollow cylindrical member employing a ceramic superconducting material, and in particular to a pipe for fabricating a coil used in a semiconducting magnet or an electrical accumulator device.

BACKGROUND OF THE INVENTION

Conventionally, a metallic material such as Nb-Ge (for example, $Nb_3Ge$) and the like is used as a superconducting material. This material has high ductility, malleability and bending property since it is a metal, and can be used for a coil in a superconducting magnet and also as an electrical accumulator coil.

However, the onset of the superconducting critical temperature (hereinafter referred to as Tc) of this metal is low, that is only 23° K. or lower. Also, if industrial applications of the material are considered, it is extremely important that the Tc be 100° K. or higher, and that the temperature where the electrical resistance becomes zero (hereinafter referred to as Tco) be 77° K. or higher.

Recently, a copper oxide ceramic has been attracting considerable attention as such a superconducting material. However, the copper oxide ceramic material is deficient in ductility, malleability and bending property, and difficult to process after forming.

Accordingly, it is required to develop an application of the copper oxide ceramic material to a coil member for use in the magnet or power accumulator device.

SUMMARY OF THE INVENTION

An object of the present invention is to provide a copper oxide ceramic member of superconducting coil structure which can have a coolant therein for cooling.

Another object of the present invention is to provide a method of producing a copper oxide ceramic member of coil structure.

Accordingly, in the present invention, a copper oxide ceramic member of superconducting coil structure comprises a hollow support body made from a member selected from a metal and a metallic compound and a copper oxide superconducting ceramic material which covers the inner surface of the hollow support body with a space kept therein.

A method of the present invention comprises the steps of providing a hollow support body made from a metal or a metal compound and introducing a solution mixed with a superconducting ceramic material including copper oxide into the inside of the hollow support body.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
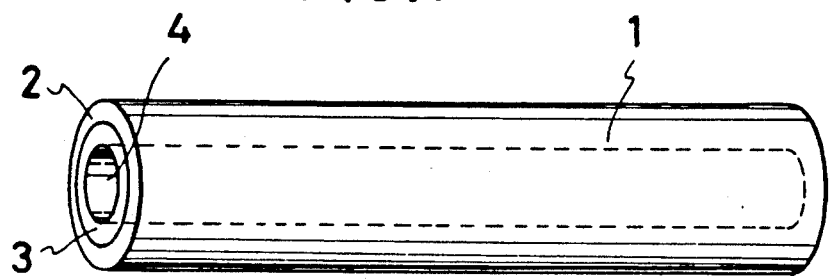
FIG. 1 is a perspective view of a superconducting ceramic pipe of the present invention.

In order to accomplish the objects mentioned above, a hollow metallic or metallic compound support member is prepared, into which a liquid having a material for the superconducting ceramic material in a mixture, solution or gel is poured from one end of the hollow support member with the other end of the support member temporarily blocked.

A representative superconducting ceramic material used in the present invention is an oxidized ceramic using elements in Gruop IIIa and IIa of the Periodic Table, and copper.

The superconducting ceramic material of the present invention can be generally represented as $(A_{1-x}B_x)_yCu_zO_w$, where $x=0.3$ to 1, $y=2.0$ to 4.0 or, preferably, 2.5 to 3.5, $z=1.0$ to 4.0 or, preferably, 1.5 to 3.5, and $w=4.0$ to 10.0 or, preferably, 6 to 8. A is one type or several types of elements from among those selected from the yttrium group and those selected from the other lanthanides. The yttrium group is defined as the group containing Y(yttrium), Gd(gadolinium), Yb(ytterbium), Eu(europium), Tb(terbium), Dy(dysprosium), Ho(holmium), Er(erbium), Tm(thulium), Lu(lutetium), Sc(scandium), and other lanthanides (Physics and Chemistry Dictionary, published by Iwanami, Apr. 1, 1963).

One example of the superconducting ceramic material is a copper oxide ceramic material represented by the formula $(A_{1-x}B_x)_yCuO_z$, where $x=0.01$ TO 0.3, $y=1.3$ to 2.2, $z=2.0$ to 4.0, and A is selected from the group of Y(yttrium), Ga(gallium), Zr(zirconium), Nb(niobium), Ge(germanium), Yb(ytterbium), and other lanthanides, and B is a superconducting ceramic material selected from a group of Ba(barium), Sr(strontium), Ca(calcium), Mg(magnesium), and Be(beryllium). The ceramic material can include another elements (referred to as A and B here) depending on its use.

The superconducting ceramic material of the present invention can also be generally represented as $(A_{1-x}B_x)_yCu_zO_w$, where $x=0.3$ to 1, $y=2.0$ to 4.0 or, preferably 2.5 to 3.5, $z=1.0$ to 4.0 or, preferably 1.5 to 3.5, and $w=4.0$ to 10.0 or, preferably 6 to 8. A is one type of element selected from the elements in Group Vb in the Periodic table, consisting of Bi(bismuth), Sb(antimony), As(arsenic), and P(phosphorous). In addition, B is at least two types of elements, B1, B2--- Bn, for example B1, B2, selected from among Ba(barium), Sr(strontium), Ca(calcium), and Mg(magnesium).

Then, the whole of the hollow member or pipe is heated to evaporate and remove the liquid or solvent, resulting in a hollow pipe coated with the superconducting ceramic material on the inner wall surface thereof.

The resulting product is heated and sintered and subjected to repeated oxidization and reduction processes to produce a superconducting ceramic material.

Next, the entire hollow pipe is heated and the solvent or liquid medium is entirely removed by vaparizarion. This causes the superconducting ceramic material to cover the inner wall of the hollow pipe. By then repeatedly heating the coating to fire it and oxidize or reduce it, a superconducting ceramic material, for example, an oxidized copper ceramic, is formed which has a molecular structure represented by $(Al_{-x} B_x)_y CuO_z$, where $x = 0.01$ to $0.3$, $y = 2.0$ to $4.0$; A is an element selected from a group of elements comprising Y(yttrium), Ga(gallium), Zr(zirconium), Nb(niobium), Ge(germanium), Yb(ytterbium), or other lanthanoids; and B is a superconducting ceramic material selected from a group of elemnents comprising Ba(barium) or Sr(strontium), Ca(calcium), Mg(magnesium), or Be(berylliun).

In the ceramic used in the present invention, elements other than those depicted by A and B can be added.

In the present invention, the superconducting ceramic material is coated as a first layer on the inner wall surface of the hollow support body or pipe, and then a second layer of ceramic material is coated over the first layer by repeating the process after the first layer of the ceramic material is sufficiently solidified. In addition, in this case, a part of the elements of A and B, and the values for x, y and z may be changed.

Of course, in the present invention these steps may be repeated to create a multilayer configuration.

When making the pipe or coil using the metallic superconducting material mentioned above, first a wire can be made by this process, then this wire is wound around a prescribed base to form a coil.

However, it is extremely difficult to form the wire rod of the ceramic superconducting material or wind the ceramic superconducting body around a base.

For this reason, in the present invention a pipe of metal or metallic compound is used, fabricated in the form of a previously prescribed bulb, coil, or endless coil with the starting and terminating points thereof connected to each other. Its interior is filled by the introduction of a liquid in which a superconducting ceramic material is slurried or dissolved. It is therefore possible to essentially create the final form of a pipe of a ceramic material by providing a coating of the superconducting material on the inner wall surface of the metal pipe.

Also, the pipe, when made as a coil or as a wire with the hollow space formed on the inside of this pipe or coil and with the superconducting ceramic material coated onto the the inner surface of the pipe, can be used as a channel for a cooling medium for cooling to the temperature Tco at which the electrical resistance becomes zero.

In addition, by winding a plurality of turns in coil shape using the pipe of the present invention, a superconducting magnet can be formed. Also, by connecting the starting and terminating ends of this coil to each other through the ceramic material the electrical resistance of which is zero, an endless coil is obtained. There is no loss of current in this coil, so it is possible to use it as an elecrtrical energy storage device.

[EXAMPLE 1]

In this embodiment, in the expression $(A_{1-x}B_x)_yCuO_z$, A was yttrium in the form $Y_2O_3$, B was barium in the form $BaCO_3$, and copper was used in the CuO form. These chemicals had 99.95% purity or more. Here, $x = 0.05$, $x = 0.075$, and $x = 0.1$, $y = 1.8$, $y = 2.0$, and $Y = 2.2$. By mixing these, 9 types of mixtures were prepared. These were compacted into tablets once at a pressure of 3 kg/cm$^2$ and fired or sintered in air (called pre-fired), first at 700° C. for 3 hours then at 1000° C. for 10 hours. The resulting product was ground into particles having an average particle diameter not larger than 100 $\mu$m- for example, about 10 $\mu$m. This mixture was enclosed in a capsule and again compacted at 5 kg/cm$^2$ to form tablets. These tablets were then fully fired in an oxidizing atmosphere, for example, in air, at 1000° C. for 10 hours. After completion, the structure was seen in the so called perovskeit-like structure, but the transformed $K_2NiF_4$-type structure was observed from X-ray analysis.

Next, the fact that this fired material had a Tc onset greater than 40° K. and preferably 90° K., and a Tco greater than 77° K. was checked from the voltage-current-temperature characteristics.

The tablets were once again ground into a fine powder. The average particle diameter ranged from 100 $\mu$m down to 5 $\mu$m, for example, 30 $\mu$m. In this process, an effort was made during grinding to avoid destroying the basic crystal structure.

This powder was slurried or dissolved in a liquid, for example, freon liquid, or an alcohol such as ethanol, or another liquid.

This liquid was poured into the hollow support body or metal pipe 2 shown in FIG. 1 which is made of, for example, copper or a copper compound (such as a NiCu compound) with the other end of the pipe blocked. The inner wall surface of the pipe 2 was coated to a uniform thickness with the ceramic powder by rotating and turning the pipe 2 from end to end, so that the powder adhered to the wall while the pipe 2 was completely heated to a temperature at 100° C. to 400° C.

In this way, the solvent was removed from the inside of the pipe 2 and the inner wall surface received a ceramic powder coating 3.

To make the coating adhere more tightly to the inner wall surface, a solvent which dissolves epoxy or acrylic resins, for example, toluene or the like, may be used.

After this, oxygen or a mixture of oxygen and argon gas is introduced into the hollow section over the dried ceramic material adhered to the inner wall surface, and the ceramic material is fired while it is being oxidized at 500° C. to 1100° C., for example, at 600° C. for 3 hours, and additionally at 800° C. for 5 hours.

Figure 3:
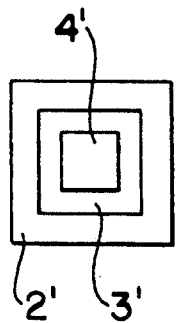
FIG. 3 is an end view of an alternate embodiment of a superconducting ceramic pipe in accordance with the present invention.

By repeating this type of process 1 to 5 times, the ceramic material was adhered to the inside of the pipe to an average thickness of 50 $\mu$m to 1 cm (as a representative figure, 0.5 mm to 5 mm). In this way, the pipe 1 of the present invention comprising a hollow support member 2 and a superconducting ceramic material 3 adhered on the inside of the support member was fabricated forming a space in the inside of the hollow support member 2 as shown in FIG. 1, In the present invention, the pipe used is a cylindrical hollow support member. However, it may also be a square hollow support member (for example, as shown in FIG. 3, in which like elements are designated with primed numbers), and other shapes can also be used.

In such a superconducting ceramic pipe, Tc had a value 5° K. to 20° K. lower than at the time the tablet was made. However, it is possible to say that this was an improvement and better than the Tc from the initial tablet.

In addition, the length in this design can be changed from several centimeters to several scores of meters. Also, the thickness can be changed from a diameter of several millimeters to one of several centimeters.

[EXAMPLE 2]

Figure 2:
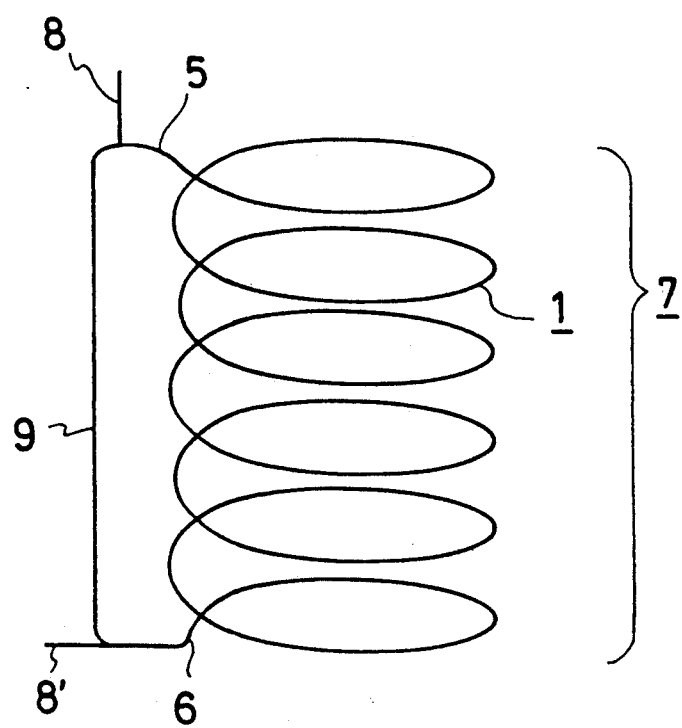
FIG. 2 is a schematic view of an example of an electical storage device using the pipe of the present invention.

This embodiment is an example of an endless coil as shown in FIG. 2 in a perspective view. This endless coil can be used as a battery for electric energy generated by a solar cell and the like.

As can be seen from this diagram, the pipe which has a previously-formed hollow space as in the first embodiment, was formed in the shape of a coil 7. In addition, a starting end 5 and a terminating end 6 were connected in the same way to a hollow pipe 9. This endless coil had a filler opening 8. This filler opening 8 can be used as input and output terminals for electrical energy.

Here, using the same method as in the first embodiment, the superconducting ceramic is slurried or dissolved in a liquid which was poured into the filler opening.

Drying the superconducting ceramic, the unnecessary solvent was driven off in the form of vapor through the openings 8, 8' and the inside of the pipe was dried. Also, in the same way as in the first embodiment, an oxidizing gas was introduced and the ceramic material was dried.

In this way, the endless coil 7 with a hollow interior was fabricated using the pipe 1 of which the inner wall surface was coated with the superconducting ceramic material. Its Tco was experimentally determined to be 45° K. However, by proper selection of the superconducting ceramic material, a higher Tco can be obtained. Also, by introducing liquid hydrogen into the hollow section, an endless coil with a closed circuit of zero resistance can be obtained so that it can be used as an electric energy storage device.

[EXAMPLE 3]

In this embodiment, in the expression $(A_{1-x}B_x)_yCuO_z$, Yb is used as A, and Ba is used as B. Consequently, even after the pipe is formed, the Tco was maintained at 72° K. Other preparation condition of this embodiment was the same as the first example.

In these examples, after such pipes are formed, the hollow inner section is filled with a cooling liquid such as liquid nitrogen or liquid hydrogen, which is a means for continuous and direct cooling of the pipe, specifically the superconducting ceramic material on the inner side, for which temperature is of the most importance.

In addition, using copper or a copper compound for the outside metal makes it possible to weld the pipe for use as part of an electrical device. The use of copper or a copper compound as the metal or metallic compound especially makes it possible to widen the application of this pipe, for example, in the field of electrical parts.

The superconducting ceramic material for use in accordance with the present invention also may be prepared consistent with the stoichiometric formulae $(A_{1-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and $x=0$ to 1; $y=2.0$ to 4.0, preferably 2.5 to 3.5; $z=1.0$ to 4.0, preferably 1.5 to 3.5; and $w=4.0$ to 10.0, preferably 6.0 to 8.0. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb, and As. B is one or more elements of Group IIa of the Periodic Table, e.g., the alkaline earth metals including beryllium and magnesium, and $x=0$ to 1; $y=2.0$ to 4.0, preferably 2.5 to 3.5; $z=1.0$ to 4.0, preferably 1.5 to 3.5; and $w=4.0$ to 10.0, preferably 6.0 to 8.0. One example of the former formulae is $YBa_2Cu_3O_x$ ($x=6$ to 8), and one example of the latter formulae is $BiCaSrCu_2O_x$ (the number of x can be substantially smaller than the oxygen amount of the former composition.)

What is claimed is:

1. A pipe utilizing a superconducting ceramic material comprising:
   a hollow support body made from a member selected from a metal and a metallic compound and a hollow copper oxide superconducting ceramic material which covers the inner surface of the hollow support body, said superconducting ceramic material having an inner surface defining a space within the hollow support body.

2. The pipe of claim 1, wherein the hollow support body is selected from the group of copper and copper compounds.

3. The pipe of claim 1, wherein the copper oxide superconducting ceramic material has a molecular structure represented by $(A_{1-x}B_x)_yCuO_z$, where $x=0.01$ to 0.3, $y=1.3$ to 2.2 and $z=2.0$ to 4.0; and A is an element selected from the group of Y(yttrium), Ga(galium), Zr(zirconium), Nb(niobium), Ge(germanium), Yb(ytterbium), and other lanthanides; and B is a superconducting ceramic element selected from the group of Ba(barium) and Sr(strontium), Ca(calcium), Mg(magnesium), and Be(beryllium).

4. The pipe of claim 1, wherein the cross-section of the pipe is square.

5. The pipe of claim 1, wherein the cross-section of the pipe is circular.

* * * * *